United States Patent [19]
Ishigaki et al.

[11] 3,988,692
[45] Oct. 26, 1976

[54] GAIN CONTROL CIRCUITS

[75] Inventors: Yoshio Ishigaki, Tokyo; Takashi Okada, Yamato, both of Japan

[73] Assignee: Sony Corporation, Tokyo, Japan

[22] Filed: Apr. 25, 1975

[21] Appl. No.: 571,686

[30] Foreign Application Priority Data
May 31, 1974    Japan.............................. 49-61532

[52] U.S. Cl.............................. 330/29; 330/30 D; 330/38 M; 330/145
[51] Int. Cl.² ......................................... H03G 3/30
[58] Field of Search ................ 330/29, 30 D, 38 M, 330/69, 145; 307/249, 250

[56] References Cited
UNITED STATES PATENTS
3,710,270    1/1973    Addis et al............................. 330/29

OTHER PUBLICATIONS

Bilotti, "A Distributed MOS Attenuator", *Proceedings Of The IEEE*, Apr. 1967, pp. 562, 563.

*Primary Examiner*—James B. Mullins
*Attorney, Agent, or Firm*—Hill, Gross, Simpson, Van Santen, Steadman, Chiara & Simpson

[57]    ABSTRACT

A gain control circuit utilizing a novel bidirectional transistor connected in shunt with a pair of outputs of a differential amplifier circuit. The novel bidirectional semiconductor device has its conduction level controlled by a variable bias source in its base circuit. By adjusting the bias source, the impedance of the bidirectional device is controlled, and hence the magnitude of the output signal developed across its terminals is controlled in gain.

8 Claims, 3 Drawing Figures

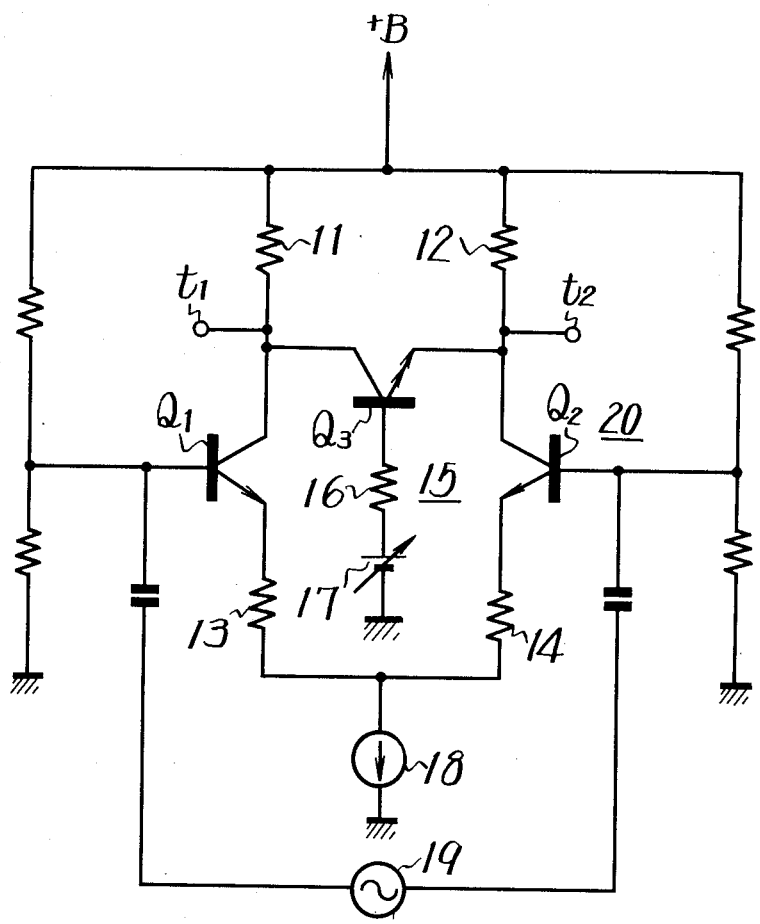

GAIN CONTROL CIRCUITS

BACKGROUND OF THE INVENTION

Field of the Invention

The field of art to which this invention pertains is gain control circuits and more particularly to gain control circuits of the differential amplifier type having a pair of input terminals to which an input signal is supplied differentially with opposite polarities.

SUMMARY OF THE INVENTION

It is an important feature of the present invention to provide an improved gain control circuit.

It is another feature of the present invention to provide a gain control circuit utilizing a novel bidirectional transistor as a variable impedance element.

It is an object of the present invention to provide a gain control circuit utilizing a novel bidirectional semiconductor device according to the present invention in conjunction with a differential amplifier for varying the impedance between the signal output terminals of the differential amplifier to control the output signal level.

It is another object of the present invention to provide a gain control circuit as described above wherein a variable bias source is connected in a base circuit of the bidirectional transistor according to the present invention to permit manual adjustment of the impedance value of the collector to emitter path of the transistor to thereby control the gain of the circuit and the amplitude of the signal output derived from the outputs of the respective transistors in the differential amplifier.

These and other objects, features and advantages of the present invention will be understood in greater detail from the following description and the associated drawings wherein reference numerals are utilized to designate a preferred embodiment.

BRIEF DESCRIPTION OF THE DRAWINGS

FIG. 3 is a schematic of a gain control circuit of the present invention utilizing the bidirectional transistor shown in FIGS. 1 and 2 and utilizing a differential amplifier arrangement with the bidirectional transistor connected at the output terminals of the differential amplifier to vary the impedance thereof in accordance with a bias adjustment means in the base circuit of the control transistor.

DESCRIPTION OF THE PREFERRED EMBODIMENT

The present invention provides a gain control circuit having a novel circuit arrangement formed with use of a bidirectionally conductive transistor, a collector-emitter path of which provides substantially the same conductivity in both directions. The bidirectionally conductive transistor is utilized as a variable impedance element for the input signal. For such a bidirectionally conductive transistor as used in the present invention, a novel semiconductor device; "LEC" transistor is applicable suitably.

The basic arrangement of the gain control circuit according to the present invention comprises a transistor with bidirectional conductivity, first and second impedance elements having the same impedance value, for example, resistors of the same value connected to a collector and an emitter of the transistor, respectively, a signal input circuit supplying an input signal to the collector and emitter of the transistor differentially with opposed polarities through the first and second impedance elements and a controllable bias circuit connected to a base of the transistor for supplying a variable bias to the transistor so as to control the impedance value of the collector-emitter path of the transistor. An output terminal is derived from the collector or emitter of the transistor or from both of them.

Advantages of the gain control circuit of the present invention reside in simplicity in circuit construction in that broad dynamic range and superior linearity in gain control are obtained. In case of use of the LEC transistor, these advantages become remarkable.

Figure 1:
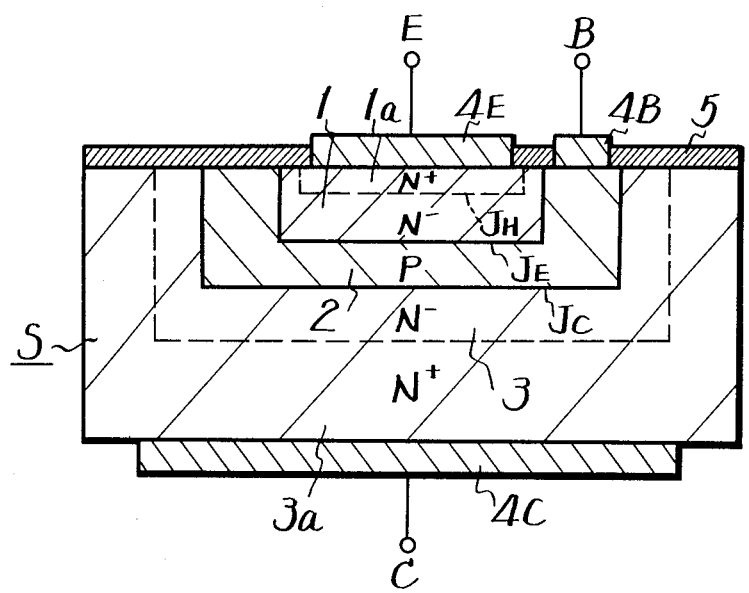
FIGS. 1 and 2 are detailed drawings of a normal three terminal bidirectional transistor according to the present invention.
Figure 2:
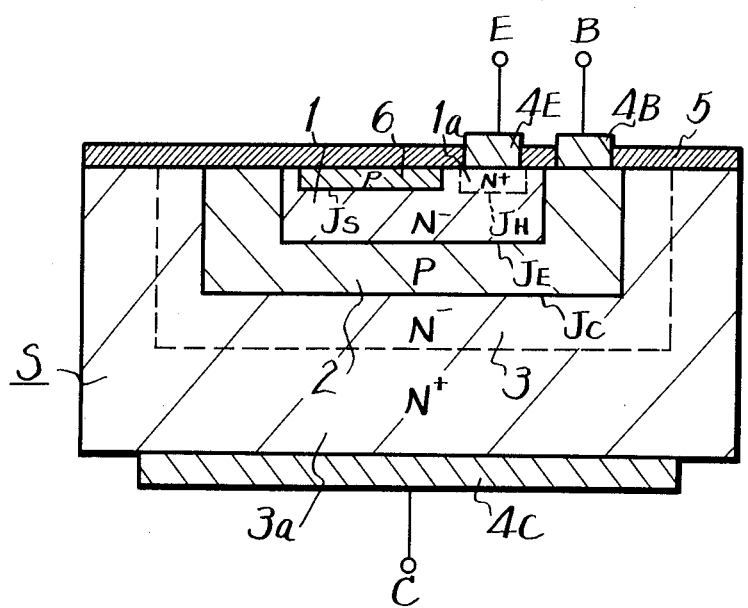

In this embodiment, a differential amplifier 20 includes a pair of transistor $Q_1$ and $Q_2$, a current sink 18 connected in common to the emitters of the transistors $Q_1$ and $Q_2$ through resistors 13 and 14, and load resistors 11 and 12 having the same resistor value connected to the collectors of the transistors $Q_1$ and $Q_2$. The bases of the transistors $Q_1$ and $Q_2$ are connected to an input signal source 19 to be supplied with an input signal differentially. A bidirectionally conductive transistor $Q_3$, for example, the novel semiconductor device shown in FIGS. 1 or 2, is provided with its collector-emitter path connected between the collectors of the transistor $Q_1$ and $Q_2$. A controllable bias circuit 15 including a variable voltage source 17 and a resistor 16 is connected to the base of the bidirectionally conductive transistor $Q_3$.

The outputs of the differential amplifier 20 which are obtained at the resistors 11 and 12 with opposite polarities are supplied to the collector and the emitter of the bidirectionally conductive transistor $Q_3$. Input signals with opposed polarities are supplied to the collector and the emitter of the transistor $Q_3$ through the resistor 11 and 12, respectively, and controlled in their magnitude in accordance with the impedance value of the collector-emitter path of the bidirectionally conductive transistor $Q_3$ which is changed by the variable voltage source 17, and the controlled ouputs are derived from output terminals $t_1$ and $t_2$.

In an example where the novel semiconductor device described above in conjunction with FIGS. 1 and 2 is employed as the bidirectionally conductive transistor $Q_3$, its first, second and third electrodes E, B, and C are used as the emitter, base and collector, respectively.

An example of the bidirectional transistor $Q_3$ shown in FIG. 3 is illustrated in FIGS. 1 or 2. Referring to these figures in greater detail, the operation of the devices becomes apparent.

The emitter-grounded current amplification factor $h_{FE}$ of a transistor, which is one of parameters evaluating the characteristics of the bipolar transistor, can be expressed by the following equation (1), if the base-grounded current amplification factor of the transistor is taken as $\alpha$.

$$h_{FE} = \alpha/(1 - \alpha) \tag{1}$$

The factor $\alpha$ is expressed as follows:

$$\alpha = \alpha^* \beta \gamma \tag{2}$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \qquad (3)$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \qquad (4)$$

$$J_p = \frac{qD_p p_n}{L_p} \left\{ \exp\left(\frac{qV}{kT}\right) - 1 \right\} \qquad (5)$$

the ratio $\delta$ of $J_n$ and $J_p$ is expressed as follows:

$$\delta = \frac{J_p}{J_n} = \frac{L_n D_p}{L_p D_n} \cdot \frac{p_n}{n_p} \qquad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; $V$ a voltage applied to the emitter junction of the transistor; $k$ the Boltzmann's constant; $T$ temperature and $q$ the absolute value of electron charge.

If it is assumed that the impurity concentration in the emitter of the transistor is taken as $N_D$ and that in the base of the transistor taken as $N_A$, the term $p_n/n_p$ can be replaced by the term $N_A/N_D$. Further, since $L_n$ is restricted by the base width $W$ and $L_n = W$, the ratio $\delta$ is expressed as follows:

$$\delta = W/L_p \cdot D_p/D_n \cdot N_A/N_D \qquad (7)$$

The diffusion constants $D_n$ and $D_p$ are functions of transfer of the carrier and temperature, and in this case they are assumed constant substantially.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \qquad (8)$$

the diffusion distance $L_p$ of the minority carriers or holes becomes short. Therefore, as may be apparent from the equation (7), $\delta$ cannot be made small so much and hence the injection efficiency $\gamma$ cannot be made high over a certain value. As a result, the current amplification factor $h_{FE}$ cannot be made high so much in the ordinary transistor.

As mentioned previously, the novel semiconductor device useable in this invention is free from the defects mentioned just above inherent to the prior art transistor. As the semiconductor device used in this invention, an NPN-type one and a PNP-type one could be considered as in the case of the prior art transistor, but an NPN-type semiconductor device useable in this invention will be now described with reference to FIGS. 1 and 2, by way of example.

As shown in FIG. 1, the NPN-type semiconductor device consists of a first semiconductor region 1 of N$^-$ type conductivity formed in a semiconductor substrate S and N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_C$ between the second and third regions 2 and 3, respectively.

With the semiconductor device useable in this invention and shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected low sufficiently such as in the order of $10^{15}$ atmos/cm$^3$ and region 1a of N$^+$ type conductivity or the impurity concentration of about $10^{19}$ atom/cm$^3$ is formed in the first region 1 to form an LH-junction and hence to form the barrier.

The impurity concentration in the second region 2 is selected in the order of $10^{15} - 10^{17}$ atom/cm$^3$ and that in the third region 3 is selected sufficiently low such as in the order of $10^{15}$ atom/cm$^3$.

In the semiconductor substrate S adjacent to the third region 3 but apart from the second junction $J_C$, there is formed a region 3a of N$^+$ type conductivity and with the impurity concentration of about $10^{19}$ atom/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, SiO₂ and formed on the surface of the substrate S.

The semiconductor device shown in FIG. 1 can be used as a transistor. In such a case, the first region 1 serves as an emitter region; the second region 2 as a base region; and the third region 3 as a collector region, respectively, a forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be made long substantially. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be taken long sufficiently.

Due to the fact that the potential barrier is formed as described above in the example shown in FIG. 1, there is performed such an effect that the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as $kT$ but the above level difference is desired to be more than 0.1 eV. Within the transition region of the potential, the diffusion distance $L_p$ of the holes must be not terminated within the transistor region, or it is required that the diffusion distance $L_p$ of the holes must be greater than the width of the transition region.

In the case that LH-junction $J_H$ is formed as shown in FIG. 1, the potential barrier of 0.2 eV can be formed by suitably selecting the amount of impurity and gradient of the high impurity concentration region 1a.

FIG. 2 shows another example of the semiconductor device useable with the invention in which reference numerals and letters same as those used in FIG. 1 indicate the same device so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

In the example of FIG. 2, the additional region 6 which has the same conductivity type as that of the second region 2 is formed in the first region 1 separated from the second region 2, but it may be possible that the second region 6 is formed being continuously extended from the second region 2.

The above description is made on the case that the first, second and third regions 1, 2 and 3 of the semiconductor device are operated as emitter, base and collector, respectively. However, in the above semiconductor devices the impurity concentrations of the first and third regions 1 and 3 surrounding the second region 2 are selected low of about equal order and they are arranged symmetrically with respect to the second region 2, so that if the first, second and third regions 1, 2 and 3 are acted as, collector, base and emitter, respectively, the semiconductor devices can be operated as a transistor reverse in the operating direction to those mentioned previously.

When the symmetry of the semiconductor devices is utilized, the symmetry can be emphasized by forming in the third region 3 a potential barrier facing the second junction $J_C$, surrounding the same and having the energy higher than that of the minority carrier or hole in the third region 3 as shown in FIGS. 1 and 2 by dotted lines outside the junction $J_C$. To this end, the region 3a of high impurity concentration in the third region 3 is so formed to surround the junction $J_C$ and the distance between the junction $J_C$ and the region 3a is selected smaller than the diffusion distance of the minority carrier or hole injected to the third region 3 at the respective parts.

The features of the novel semiconductor devices described above can be summarized as follows which will be apparent from the above description.

1. The current amplification factor $h_{FE}$ is high and can be increased more than 3000.

2. The current amplification factor $h_{FE}$ is uniform. That is, with a prior art transistor, the impurity concentration of the emitter region is selected sufficiently high so as to increase the emitter injection efficiency or the current amplification factor of the prior art transistor depends upon the difference of the impurity concentrations near the junction between the emitter and base regions, so that it is required to select the impurity concentrations in both the regions relatively. On the contrary, in the semiconductor devices for use with the invention, by forming the potential barrier in the emitter region 1 facing the emitter junction $J_E$, the current component of the minority carrier injected in the emitter region 1 is suppressed to increase the emiter injection efficiency, so that the mutual influence between the emitter and base regions 1 and 2 is small due to the fact that the emitter region 1 is selected relatively low in impurity concentration, and the width of the base region 2 and the distribution of impurity concentration therein can be selected as planned and hence $h_{FE}$ can be uniformed as described above.

3. Since the affect by the surface recombination is avoided, the current amplification factor $h_{FE}$ can be made high even if the current is low.

4. The noise can be reduced. That is, since the main parts of the first and second junctions $J_E$ and $J_C$ are formed between the low impurity concentration regions of P and N conductivity types, crystal defects are small. Further, if the impurity concentration near the electrode 4B attached to the second region 2, by way of example, is selected high, a component of the emitter-base current, as the transistor, along the surface of the semiconductor substrate S can be reduced. Therefore, the noise of $1/f$ can be reduced. Further, the burst noise and noise of $1/f$ can be also reduced by the fact that $h_{FE}$ is high. In addition, if a base expansion resistance $\gamma_{bb}'$ is made small, the noise can be reduced even if the impedance of a signal source is low.

5. The current amplification factor $h_{FE}$ is good in temperature characteristics.

6. The semiconductor devices can be used as bidirectionally conductive transistors, respectively, and are excellent in symmetry.

7. Since the impurity concentration in the vicinity of the first and second junctions $J_E$ and $J_C$ is low, $BV_{BEO}$ (collector-opened base-emitter voltage) is high for both the forward and reverse directions of transistors.

8. When the semiconductor devices are used as a power transistor, their strength is high because their emission is made uniform by their distributed inner resistance in their emitter region.

9. Saturation characteristics are superior.

10. When the region 6, which carries out injection or re-injection, is formed, the equivalent resistance of the base is made low.

The invention has the basis on the fact that the above novel semiconductor device has a body structure symmetrical with respect to the second region 2, and provides a novel circuit which is good in balance and small in number of elements used therein by employing the above novel semiconductor device.

We claim as our invention:

1. A gain control circuit comprising:
a bidirectional transistor having first, second and third terminals,
first and second impedance elements coupled in said circuit,
means for applying a time varying signal having a first polarity to said first terminal,
said time varying signal being coupled through said first impedance element,
means for applying a time varying signal of a second opposing polarity to said third terminal,
said opposing time varying signal being coupled through said second impedance element,
means for applying a controllable bias to said second terminal for placing said bidirectional transistor in a controllable state of conduction,
said controllable bias being linearly variable with respect to a manually adjustable gain adjustment means,
said bidirectional transistor being responsive to gain control operation by the use of both positive and negative values of said controllable bias with respect to a threshold bias value, and
output means coupled to one of said first and third terminals for deriving a gain controlled signal therefrom.

2. A gain control circuit in accordance with claim 1 wherein said output means is coupled to both of said first and third terminals whereby said bidirectional transistor acts as a shunt to said output means.

3. A gain control circuit in accordance with claim 1 wherein a differential amplifier is provided to supply said time varying signals of opposing polarities to said first and third terminals of said bidirectional transistor.

4. A gain control circuit comprising:
a bidirectional transistor having a first semiconductor region of one conductivity type,
a second semiconductor region of the opposite conductivity type adjacent said first region with a first semiconductor junction therebetween,
a third semiconductor region of the same type as said first region adjacent said second region with a second semiconductor junction therebetween,
said first region being associated with a potential barrier having energy higher than that of minority carriers injected from the second region to the first region,
said barrier being provided at a position facing said first junction and spaced from the same by a distance smaller than the diffusion distance of the minority carriers, and first, second and third terminals coupled to said first, second and third regions, respectively,
first and second impedance elements coupled in said circuit,
means for applying a time varying signal having a first polarity to said first terminal,
said time varying signal being coupled through said first impedance element,
means for applying a time varying signal of a second opposing polarity to said third terminal,
said opposing time varying signal being coupled through said second impedance element,
means for applying a controllable bias to said second terminal for placing said bidirectional transistor in a controllable state of conduction, and
output means coupled to one of said first and third terminals for deriving a gain controlled signal therefrom.

5. A gain control circuit in accordance with claim 4 wherein said first and third regions of the semiconductor device each have a first portion with an impurity concentration substantially the same order of magnitude and said first region is provided therein with a second portion having an impurity concentration higher than said first portion of the first region at a position spaced from said first junction by a distance smaller than the diffusion distance of the minority carriers to establish said potential barrier.

6. A gain control circuit in accordance with claim 4 wherein said first and third regions each have a first portion with an impurity concentration of substantially the same order of magnitude and an additional semiconductor region of the same type as said second region is provided in contact with said first region at a position spaced from said first junction by a distance smaller than the diffusion distance of the minority carriers to establish said potential barrier.

7. A gain control circuit in accordance with claim 4 wherein a differential amplifier is provided to supply said time varying signals of opposing polarities to said first and third terminals of said bidirectional transistor.

8. A gain control circuit in accordance with claim 7 wherein said means for applying a controllable bias to said second terminal comprises a manually variable voltage source.

\* \* \* \* \*